United States Patent
Oseki et al.

(10) Patent No.: US 8,969,871 B2
(45) Date of Patent: Mar. 3, 2015

(54) FIELD-EFFECT TRANSISTOR, PROCESSES FOR PRODUCING THE SAME, AND ELECTRONIC DEVICE USING THE SAME

(75) Inventors: Yosuke Oseki, Kanagawa (JP); Yoshimasa Sakai, Kanagawa (JP); Akira Ohno, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 59 days.

(21) Appl. No.: 13/269,205

(22) Filed: Oct. 7, 2011

(65) Prior Publication Data

US 2012/0086008 A1  Apr. 12, 2012

Related U.S. Application Data (63) Continuation of application No. PCT/JP2010/056325, filed on Apr. 7, 2010.

(30) Foreign Application Priority Data

Apr. 10, 2009  (JP) .................. 2009-096131

(51) Int. Cl.
| | | |
|---|---|---|
| H01L 29/04 | (2006.01) | |
| H01L 51/40 | (2006.01) | |
| H01L 21/336 | (2006.01) | |
| H01L 29/417 | (2006.01) | |
| H01L 51/10 | (2006.01) | |
| H01L 29/78 | (2006.01) | |
| H01L 51/00 | (2006.01) | |

(52) U.S. Cl.
CPC ........ H01L 29/41725 (2013.01); H01L 51/105 (2013.01); *H01L 29/78* (2013.01); *H01L 51/0023* (2013.01)
USPC ................. 257/57; 438/99; 438/285

(58) Field of Classification Search
USPC ....................... 438/99, 285; 257/57
See application file for complete search history.

(56) References Cited

U.S. PATENT DOCUMENTS

| | | | | |
|---|---|---|---|---|
| 6,569,707 | B2 * | 5/2003 | Dimitrakopoulos et al. | ... 438/99 |
| 6,963,080 | B2 * | 11/2005 | Afzali-Ardakani et al. | ..... 257/40 |
| 6,992,324 | B2 * | 1/2006 | Nagayama | ...................... 257/40 |

(Continued)

FOREIGN PATENT DOCUMENTS

| | | |
|---|---|---|
| CN | 1979913 A | 6/2007 |
| JP | 9-197435 A | 7/1997 |

(Continued)

OTHER PUBLICATIONS

International Search Report issued May 18, 2010 in PCT/JP2010/056325 filed Apr. 7, 2010.

(Continued)

*Primary Examiner* — Karen Kusumakar
(74) *Attorney, Agent, or Firm* — Oblon, McClelland, Maier & Neustadt, L.L.P.

(57) ABSTRACT

Provided is a field-effect transistor which has a high mobility and a low variation of mobility.
A field-effect transistor at least comprising a substrate, a semiconductor layer, a source electrode, and a drain electrode is produced by forming the source electrode and/or the drain electrode so that the source electrode and/or the drain electrode has a taper shape in a cross-section which is parallel with a channel length direction and perpendicular to the substrate, and forming the semiconductor layer through coating process.

18 Claims, 6 Drawing Sheets

(56) References Cited

U.S. PATENT DOCUMENTS

| | | |
|---|---|---|
| 7,081,641 B2 | 7/2006 | Kawasaki et al. |
| 7,193,237 B2 | 3/2007 | Aramaki et al. |
| 7,208,756 B2* | 4/2007 | Shih et al. .................. 257/40 |
| 2001/0050532 A1* | 12/2001 | Eida et al. .................. 313/504 |
| 2003/0207505 A1* | 11/2003 | Theiss et al. ................ 438/158 |
| 2004/0188755 A1* | 9/2004 | Tarui et al. .................. 257/328 |
| 2005/0056897 A1* | 3/2005 | Kawasaki et al. ........... 257/359 |
| 2006/0145148 A1* | 7/2006 | Hirai et al. .................. 257/40 |
| 2007/0278492 A1* | 12/2007 | Song et al. .................. 257/72 |
| 2007/0281386 A1* | 12/2007 | Park ............................ 438/99 |
| 2008/0012008 A1* | 1/2008 | Song et al. .................. 257/40 |
| 2008/0283833 A1 | 11/2008 | Kim et al. |
| 2009/0072224 A1 | 3/2009 | Aramaki et al. |
| 2010/0176837 A1* | 7/2010 | Kummel et al. ............. 324/765 |

FOREIGN PATENT DOCUMENTS

| | | |
|---|---|---|
| JP | 09-312334 | 12/1997 |
| JP | 10-003091 | 1/1998 |
| JP | 10-098099 | 4/1998 |
| JP | 11-204414 | 7/1999 |
| JP | 2003-304014 | 10/2003 |
| JP | 2005-093542 | 4/2005 |
| JP | 2005-223049 | 8/2005 |
| JP | 2006-165533 | 6/2006 |
| JP | A-2006-245559 | 9/2006 |
| JP | 2007-115944 A | 5/2007 |
| JP | 2007-524241 A | 8/2007 |
| JP | 2007-266355 | 10/2007 |
| JP | 2008-066510 | 3/2008 |

OTHER PUBLICATIONS

Shinji Aramaki et al.; "High Resolution AM-OLED Pixel Array using Solution Processed Organic TFTs"; AM-FPD, 2006, pp. 57-28.

Combined Chinese Office Action and Search Report issued on May 28, 2013 in Chinese patent Application No. 201080014681.7 with English translational.

Japanese Office Action, Sep. 24, 2013, with English language translation.

Chinese 2$^{nd}$ Notification of Office Action with English translation, 13 pp., issued on Jan. 21, 2014 in corresponding Chinese application 201080014681.7.

Office Action issued Mar. 25, 2014 in Japanese Patent Application No. 2011-508379 (with English language translation).

Combined Office Action and Search Report issued on Aug. 4, 2014, in Chinese Patent Application No. 201080014681.7 with English translation.

Office Action (Pretrial Report) in corresponding Japanese Application No. 2011-508379 issued on Oct. 21, 2014 with attached English language translation.

* cited by examiner

FIELD-EFFECT TRANSISTOR, PROCESSES FOR PRODUCING THE SAME, AND ELECTRONIC DEVICE USING THE SAME

TECHNICAL FIELD

The present invention relates to a field-effect transistor, processes for producing the same, and an electronic device using the transistor.

BACKGROUND ART

Electronic devices such as field-effect transistors have hitherto been produced through element production processes conducted under high vacuum, such as vapor deposition, PVD (physical vapor deposition), and CVD (chemical vapor deposition). The production lines hence have necessitated expensive equipment and required much energy.

Meanwhile, semiconductor materials for coating process, from which semiconductor layers can be formed by a coating process, have an advantage that an electronic device having a large area can be produced at low cost with low energy without requiring expensive equipment.

An example of such semiconductor materials is shown in patent document 1, which includes a statement to the effect that a bicyclic compound is applied to a substrate and converted to a semiconductor material to produce a field-effect transistor. In this process, a bicyclic compound having high solubility is heated to thereby eliminate ethylene therefrom and convert the structure thereof into a highly planar structure. Thus, an organic semiconductor layer having high crystallinity is formed from an organic thin film which is amorphous or substantially amorphous. Consequently, the bicyclic compound, even though bicyclic compound with low molecular weight, can form a film through a coating process and a field-effect transistor having a higher mobility can be formed.

Meanwhile, a technique is known in which the contact resistance which arises at an electrode/interface of a bottom contact type field-effect transistor is reduced by controlling the shape of the electrode. Patent document 2 includes a statement to the effect that in the case of a source/drain electrode having a tapered portion on the channel side, a reduction in contact resistance can be attained by regulating the channel-length-direction width of the tapered portion so as to be less than the average grain diameter of the semiconductor crystals. Specifically, a Cr adhesion layer and a source/drain electrode constituted of Au are formed so that a cross-section thereof forms an angle (taper angle) of 45° or larger with the substrate, and the tapered portion is regulated so as to have a width that is smaller than 50 nm, which is the average size of the pentacene crystals to be generated on the electrode by vacuum deposition. Thus, a reduction in contact resistance is attained. This technique is a contrivance by which the semiconductor crystals to be in contact with the region located within a height of 10 nm from the gate insulator that forms a channel are prevented from growing from nuclei present on the electrode. The patent document hence includes a statement to the effect that even when the source/drain electrode is formed in a normally tapered shape or an inversely tapered shape with respect to the substrate, a reduction in contact resistance is possible equally.

Furthermore, patent document 3 and patent document 4 describe transistors which each include a source/drain electrode having a tapered shape, as improvements of the prior-art technique disclosed in patent document 2. Patent document 3 discloses a technique in which an organic-compound layer is disposed selectively at the interface between a source electrode and a semiconductor layer or at the interface between a drain electrode and a semiconductor layer to thereby reduce image force during carrier movement, facilitate tunneling, and obtain a large operating frequency and small power consumption. Patent document 4 discloses a technique in which a planarization layer is disposed over the groove present between a source electrode and a drain electrode to thereby improve the mobility of charges regardless of the shapes of the source electrode and drain electrode. These patent documents each disclose a technical idea which does riot relate to a tapered electrode shape.

PRIOR-ART DOCUMENTS

Patent Documents

Patent Document 1: JP-A-2003-304014
Patent Document 2: JP-A-2005-93542
Patent Document 3: JP-A-2008-66510
Patent Document 2: JP-A-2007-266355

SUMMARY OF THE INVENTION

Problems that the Invention is to Solve

Conventional field-effect transistors have had problems that the transistors have an insufficient mobility and have a variation of mobility. Investigations made by the present inventors revealed that in the case where a semiconductor layer is formed by a coating process, there is a problem that when the source/drain electrode, in a cross-section which is parallel with the channel length direction and perpendicular to the substrate, has a side surface which faces the channel region and forms a large angle with the substrate, then the results are a decrease in mobility and an enhanced variation of mobility.

An object of the invention, which has been accomplished in view of those problems, is to provide a method for heightening the mobility of a field-effect transistor produced using a semiconductor material for coating process and for reducing mobility variation.

Means for Solving the Problems

The present inventors diligently made investigations in order to overcome the problems described above. As a result, the inventors have found that an improvement in mobility and a reduction in mobility variation in a field-effect transistor having a semiconductor layer formed by a coating process can be rendered possible by forming a source/drain electrode so that the source/drain electrode has a taper shape in a cross-section which is parallel with the channel length direction and perpendicular to the substrate. The invention has been thus completed. Namely, the invention resides in the following configurations.

(1) A field-effect transistor which at least comprises a substrate, a semiconductor layer formed through coating process, a source electrode, and a drain electrode, wherein, in a cross-section which is parallel with a channel length direction and perpendicular to the substrate, the source electrode and/or the drain electrode has a taper shape and the taper shape forms an angle of 70° or less with the substrate.

(2) The field-effect transistor according to (1) above wherein the semiconductor is an organic semiconductor having an annulene structure.

(3) The field-effect transistor according to (1) or (2) above which has a variation of mobility of ±30% or less.

(4) A process for producing a field-effect transistor at least comprising a substrate, a semiconductor layer, a source electrode, and a drain electrode, the process comprising: forming the source electrode and/or the drain electrode so that the source electrode and/or the drain electrode has a taper shape in a cross-section which is parallel with a channel length direction and perpendicular to the substrate; and coating a coating solution that contains a semiconductor.

(5) A process for producing a field-effect transistor at least comprising a substrate, a semiconductor layer, a source electrode, and a drain electrode, the process comprising: forming the source electrode and/or the drain electrode so that the source electrode and/or the drain electrode has a taper shape in a cross-section which is parallel with a channel length direction and perpendicular to the substrate; coating a coating solution that contains a precursor for a semiconductor; and converting the precursor to the semiconductor by heating and/or light irradiation.

(6) The process for producing a field-effect transistor according to (4) or (5) above wherein the source electrode and/or drain electrode which has a taper shape is formed by forming two photoresist layers, exposing the photoresist layers to light, removing the uncured portions, forming a metal layer, and then removing unnecessary portions of the metal layer by a lift-off method.

(7) A field-effect transistor produced by the process according to any one of (4) to (6) above.

(8) A method for improving a mobility of a field-effect transistor at least comprising a substrate, a semiconductor layer formed through coating process, a source electrode, and a drain electrode, wherein when the field-effect transistor is produced, the source electrode and/or the drain electrode is formed so that the source electrode and/or the drain electrode has a taper shape in a cross-section which is parallel with a channel length direction and perpendicular to the substrate, thereby improving the mobility.

(9) An electronic device which comprises the field-effect transistor according to any one of (1) to (3) and (7) above.

Effects of the Invention

According to the invention, a field-effect transistor having a high mobility and a low variation of mobility can be obtained using a semiconductor material for coating process.

MODES FOR CARRYING OUT THE INVENTION

Embodiments of the invention are explained below in detail.

The invention provides, according to one aspect thereof, a field-effect transistor which comprises a substrate, a semiconductor layer formed through coating process, a source electrode, and a drain electrode, wherein in a cross-section which is parallel with the channel length direction and perpendicular to the substrate, the source electrode and/or the drain electrode has a taper shape and the taper shape forms an angle of 70° or less with the substrate.

(Source Electrode and Drain Electrode)

The source electrode and/or the drain electrode in the invention is wherein the electrode has a taper shape in a cross-section thereof which is parallel with the channel length direction and perpendicular to the substrate, and that the angle formed by the taper shape and the substrate is 70° or less.

Figure 1:
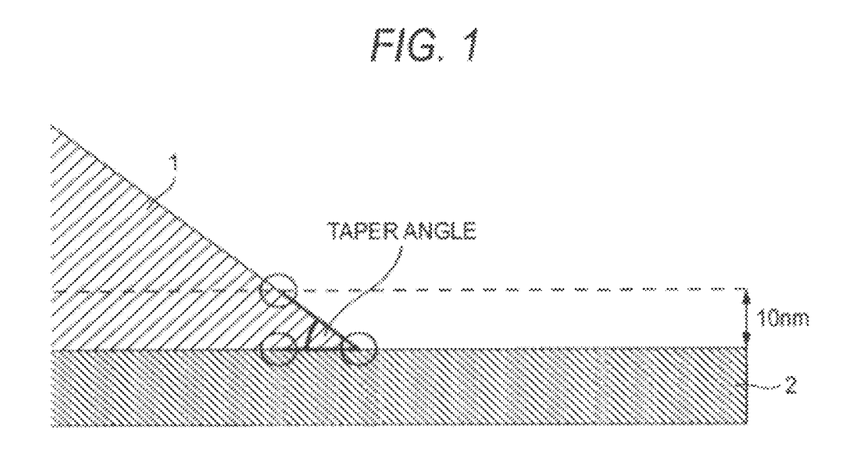
FIG. 1 is a diagrammatic view showing a cross-section of a source or drain electrode, the cross-section being parallel with the channel length direction and perpendicular to the substrate and being for illustrating the taper angle according to the invention.

In the invention, the term "channel region" means the region sandwiched between the source electrode and drain electrode which face each other, and the term "channel length" means the distance between the source electrode and the drain electrode. Furthermore, the term "channel length direction" means the direction which connects the source electrode and the drain electrode. Consequently, the "cross-section which is parallel with the channel length direction and perpendicular to the substrate" in the invention corresponds to the "cross-section" which is shown in FIG. 1. In the invention, the field-effect transistor is wherein the source electrode and/or the drain electrode has a taper shape in that cross-section as shown in FIG. 1. The term "taper shape" means the shape of a tip portion which becomes gradually narrower toward the tip. Consequently, the expression "the source electrode and/or the drain electrode has a taper shape in the cross-section" means that the source electrode and/or the drain electrode has a tip portion which is in contact with the channel and with the surface of the gate insulator and that side surface of the source electrode and/or drain electrode which faces the channel region is inclined to the substrate.

In the invention, the term "angle formed by the taper shape and the substrate" means the angle that the side surface of the source electrode and/or drain electrode which faces the channel region forms with the substrate as shown in FIG. 1 (as stated above, that side surface is inclined to the substrate). This angle is often referred to as "taper angle".

Specifically, the "angle formed by the taper shape and the substrate (taper angle)" in the invention is defined as the angle which, in a cross-section that is parallel with the channel length direction and perpendicular to the substrate, the straight line which connects the tip of the electrode and that point on the electrode side surface facing the channel region which is located at a height of 10 nm from the bottom forms with the plane of the gate insulator. FIG. 1 illustrates a method for measuring the taper angle according to the invention. A cross-section of the electrode is photographed with an SEM at a magnification of 50,000 diameters or more, and the tip of the electrode and the point on the electrode side surface which is located at a height of 10 nm from the bottom are set on the photograph. The angle can be thus measured. In case where the taper angle exceeds 90°, this shape is an "inverted taper shape" and is distinguished from the "taper shape" according to the invention.

By further reducing the taper angle, the mobility of the field-effect transistor produced using a semiconductor material of the coating process type can be improved and the variation of mobility can be reduced. This is presumed to be because by reducing the angle, a void is inhibited from generating at the interface between the source/drain electrode and the semiconductor layer when the semiconductor of the coating process type is formed into a film or when the semiconductor layer contracts upon heating.

In the invention, the term "mobility" means a value determined by examining the output characteristics of a produced semiconductor element with semiconductor parameter analyzer Agilent 4155c in dry nitrogen and calculating the value from $\sqrt{I_d^{sat}}$ and the slope of the straight line of $V_g$ using the following expression (1).

Expression (1)

$$I_d^{sat} = \frac{WC_i}{2L} \mu^{sat} (V_g - V_{th})^2 \quad \text{[Math. 1]}$$

In expression (1), $I_d^{sat}$ is drain current, W is channel width, $C_i$ is the capacitance of gate insulator, L is channel length, $\mu^{sat}$ is mobility, $V_g$ is gate voltage, and $V_{th}$ is threshold voltage.

The term "variation of mobility" in the invention means the range in which the mobilities of five samples produced and examined under the same conditions are distributed around the average of the mobilities as the center. According to the invention, the variation of mobility of the field-effect transistor produced using a semiconductor material of the coating process type can be reduced to ±30% or less, preferably ±10% or less.

The effects of the invention can be obtained so long as the source electrode and/or the drain electrode has a taper shape in a cross-section which is parallel with the channel length direction and perpendicular to the substrate, that is, so long as the angle formed by the taper shape and the substrate (taper angle) is less than 90°. However, it is preferred that the taper angle should be 70° or less, because the excellent effect of improving the mobility and the excellent effect of reducing the variation of mobility are obtained in this case. The taper angle is more preferably 45° or less, even more preferably 30° or less. Too large values of the angle result in cases where when a semiconductor material of the coating process type is formed into a film, a proper junction is not formed between the semiconductor layer and the electrode and where a void generates at the interface between the semiconductor layer and the electrode when the semiconductor layer contracts upon crystallization or heating after film formation. Such defects exert adverse influences on semiconductor characteristics. Meanwhile, so long as the angle formed by the taper shape and the substrate (taper angle) is larger than 0°, the effects of the invention are obtained. The taper angle substantially is 0.1° or larger.

The kind of the source/drain electrode in the invention is not particularly Limited. Specifically, use can be made of metals such as Au, Co, Cu, Ir, Mo, Ni, Pd, Pt, Te, and W and alloys. An oxide layer may be formed on the surface of a source/drain electrode of any of these metals by heating the surface thereof in air or in an oxygen atmosphere or by subjecting the surface to a UV/ozone treatment or $O_2$ plasma treatment. Also usable besides these are metal oxides such as $Mo_x$, $NiO_x$, $CoO_x$, $CuO_x$, ITO, IZO, IWZO, and IGZO.

The source/drain electrode can adjoin an electrode adhesion layer. The electrode adhesion layer is not particularly limited. Specifically, use may be made of metals such as Cr, Mo, Ni, and Ti, alloys, and metal oxides such as $MoO_x$, $NiO_x$, $CuO_x$, $MoO_x$, and $MnO_x$.

Incidentally, in the case of a p-type semiconductor, it is preferred that the surface of the source/drain electrode or of the electrode adhesion layer should have a work function of 4.5 eV or higher. The work function thereof is more preferably 5.0 eV or higher. There is no particular upper limit thereon. It is, however, preferred that the work function thereof should be 10 eV or less.

In the invention, the source electrode and/or the drain electrode has been formed so as to have a taper shape in a cross-section which is parallel with the channel length direction and perpendicular to the substrate (hereinafter this electrode is often referred to as "tapered electrode"). Methods for forming such an electrode are explained below.

For forming a tapered source/drain electrode, the following method can be used: a lift-off method in which use is made of a two-layer resist obtained by forming a film of a photoresist on a lower resist layer which is not photosensitive, exposing the photoresist to light, and then developing the layers while regulating the developing time to thereby form a shape in which the upper photoresist layer overhangs like a penthouse; a lift-off method in which a photoresist that by itself can form an overhang shape is used; wet etching in which an isotropic etching liquid is used; dry etching in which an isotropic etching gas is used; dry etching in which an end of a photoresist is tapered or a resist loss is utilized; or printing, e.g., ink jet printing, in which the viscosity of an ink, surface energy of the gate insulator, etc. are controlled. The shape of the taper can be regulated by changing the shape of the lift-off resist, method and conditions for forming a film of the electrode material, etc. It is also possible to regulate the shape of the taper by changing the compositions and other properties of the etching gas and etching liquid. In a printing process, a taper shape can be formed by regulating the surface tension and viscosity of a conductive ink, the surface energy of the insulating film, etc.

(Substrate)

The kind of the substrate in the invention is not particularly limited. Specifically, use can be made of inorganic materials such as glass and quartz, insulating plastics such as polyimide films, polyester films, polyethylene films, poly(phenylene sulfide) films, and poly(p-xylene) films, and hybrid substrates based on a combination of an inorganic material, a metal/alloy plate, and an insulating plastic. Furthermore, use may be made of a structure composed of the gate insulator which will be described later and a substrate integrated therewith, such as a conductive n-type silicon wafer.

(Semiconductor Layer)

The semiconductor layer in the invention is characterized by being formed through coating process.

Formation of the semiconductor layer through coating process enables the field-effect transistor to be produced at a lower cost as compared with formation of a semiconductor layer by a vacuum process. Furthermore, the influence of the underlying layers on semiconductor crystallization is reduced as compared with the case where a semiconductor layer was formed by vacuum deposition and, as a result, the difference in crystal growth between the surface of the insulating film and the surface of the source/drain electrode is reduced. Consequently, by forming a tapered source/drain electrode, the growth of crystals which each lie across the interface between the source/drain electrode and the gate insulator is accelerated and a void is less apt to generate at the interface between the electrode tip portion, which is important for charge injection, and the semiconductor layer.

Methods for the coating process are not particularly limited. Examples thereof include techniques such as spin coating, ink-jet printing, aerosol-jet printing, microcontact printing, dip-pen lithography, screen printing, letterpress printing, intaglio printing, and gravure offset printing.

Methods for forming a semiconductor layer through coating process are not particularly limited. Examples thereof include (a) a method in which a coating solution containing a semiconductor is applied and dried to form a semiconductor layer and (b) a method in which a coating solution containing a precursor for a semiconductor is applied and the precursor is thereafter converted to the semiconductor to obtain a semiconductor layer.

In method (a), crystallization occurs simultaneously with solvent removal and, hence, crystal growth is apt to be changed by solvent removal conditions, etc. On the other hand, method (b) has an advantage that since crystallization is caused to occur after a precursor film is formed temporarily, it is easy to keep crystallization conditions constant and an even crystal film is easy to obtain. It is, however, noted that the semiconductor film has contracted considerably because of a decrease in molecular size due to substituent elimination and because of high crystallinity and, hence, method (b) has a problem that a void is apt to generate at the interface between the source/drain electrode and the semiconductor layer during crystallization. However, by forming a tapered source/drain electrode in accordance with the invention, the growth of crystals in the semiconductor layer which lie across the interface between the source/drain electrode and the gate insulator can be accelerated and, hence, a void can be inhibited from generating at the interface between the source/drain electrode and the semiconductor layer during crystallization. Consequently, better results are obtained in the invention when use is made of the method (b), in which a coating solution containing a precursor for a semiconductor is applied and the precursor is thereafter converted to the semiconductor to obtain a semiconductor layer.

The semiconductor is not particularly limited. The semiconductor may be a p-type semiconductor or an n-type semiconductor, and an organic semiconductor material or an inorganic semiconductor material may be used. Examples of the organic material include acenes such as pentacene, heterocycle-containing fused-ring aromatic compounds such as benzothiophene, and annulene compounds such as porphyrins and phthalocyanines. Preferred of these are annulene compounds such as porphyrins and phthalocyanines. Examples of the inorganic material include silicon and oxide semiconductors such as ZnO.

The precursor for a semiconductor is not particularly limited so long as the precursor is a substance which comes to have semiconducting properties through conversion. Methods for the conversion also are not particularly limited. Examples thereof include compounds having a bicyclic structure of the heat/light conversion type which undergoes a reverse Diels-Alder reaction upon heating or light irradiation, such as annulene compounds, acenes (e.g., naphthalene, anthracene, and pentacene), aromatic oligomers (e.g., oligothiophene and oligofuran), and heterocycle-containing fused-ring aromatic compounds (e.g., benzothiophene and thienothiophene). Examples of the inorganic material include cyclopentasilane, which undergoes ring opening upon light irradiation. Preferred are bicyclic structures of the heat conversion type which undergoes a reverse Diels-Alder reaction upon heating. Preferred of these are bicycloporphyrins shown in formula (I).

The precursor for a semiconductor is converted to the semiconductor by heating, light irradiation, etc. Conditions for the conversion can be suitably selected according to the kind of the precursor. For example, a porphyrin having a bicyclic structure that undergoes a reverse Diels-Alder reaction upon heating, which undergoes the conversion shown by formula (I), is converted under the heating conditions of 150° C. or higher.

[Chem. 1]

Formula (I)

The compounds shown below are semiconductor precursors that are converted by heating into pentacene and PTV (polythienylenevinylene), which have semiconducting properties. These precursor compounds also can be effectively used in the invention.

[Chem. 2]

Precursor

Pentacene

Precursor

PTV (polythienylenevinylene)

(Gate Electrode)

The gate electrode in the invention is not particularly limited. Specifically, use can be made of a conductive n-type Si wafer, metals such as Ta, Al, Cu, Cr, Mo, W, and Ti, alloys and multilayer films of these metals, conductive polymers such as polyaniline, polypyrrole, and PEDOT, and conductive inks containing metal particles.

(Gate Insulator)

The kind of the gate insulator in the invention is not particularly limited. Specifically, use may be made of a method in which an insulating polymer such as a polyimide, poly (vinylphenol), poly(vinyl alcohol), or epoxy is applied and burned or a method in which $SiO_2$, $SiN_x$, aluminum oxide, tantalum oxide, or the like is deposited by CVD or sputtering. In the case where tantalum or aluminum is used as the gate electrode, the tantalum oxide or aluminum oxide formed on the gate electrode surface by a UV/ozone treatment, anodization, or the like may be used.

(Field-Effect Transistor)

Figure 2:
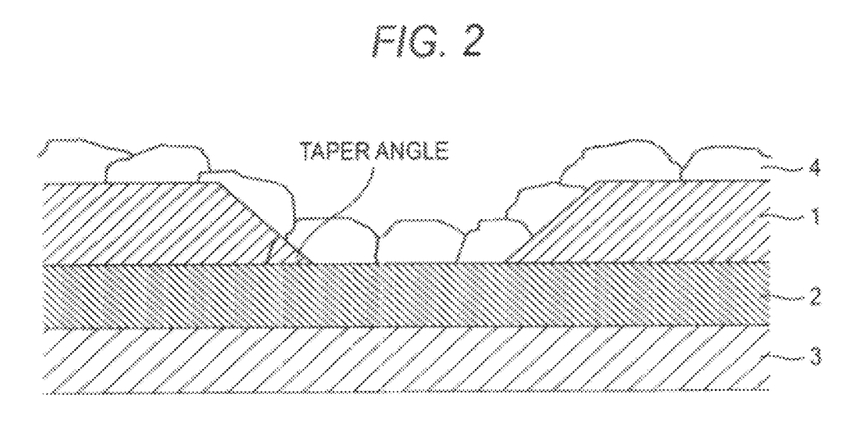
FIG. 2 is a diagrammatic sectional view showing the structure of a field-effect transistor according to one embodiment of the invention.

In FIG. 2 is shown a diagrammatic sectional view of a field-effect transistor of the bottom-contact bottom-gate type which employs the invention. Other examples of the structure of a field-effect transistor which employs the invention include the bottom-contact top-gate type and the top/bottom-contact type. Furthermore, use may be made of the dual gate type which has gate electrodes respectively over and under the source/drain electrode.

(Applications of the Field-Effect Transistor)

The field-effect transistor of the invention can be utilized in electronic devices and photoelectric devices, preferably in electronic devices. Examples of the electronic devices include display elements, electronic tags, and electromagnetic and pressure sensors.

EXAMPLES

The invention will be explained below in more detail by reference to Examples. The invention should not be construed as being limited to the Examples unless the invention departs from the spirit thereof.

Example 1

Use was made of a plate obtained by forming a thermally oxidized silicon film having a thickness of 300 nm as a gate insulator on a surface of a conductive n-type silicon wafer serving as both a substrate and a gate electrode. The gate insulator had a capacitance ($C_i$) of $1.15 \times 10^{-4}$ F/m² when the permittivity thereof was taken as 3.9.

Figure 3:
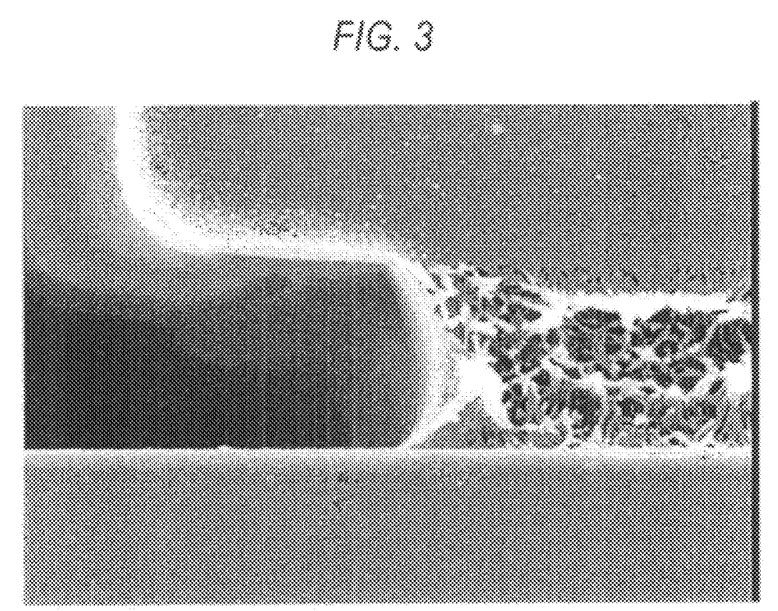
FIG. 3 is an SEM image of a cross-section of the two-layer resist formed in Example 1.

Subsequently, a polymethylglutarimide (PMGI) resist (SF-9, manufactured by Kayaku Microchem Co., Ltd.) was applied in a thickness of 0.5 μm on the thermally oxidized silicon film by spin coating and then heated at 180° C. for 5 minutes. Furthermore, a negative type photoresist (ZPN-1150, manufactured by Nippon Zeon Co., Ltd.) was applied in a thickness of 4 μm on the resultant resist film by spin coating and then heated at 80° C. for 180 seconds. Thereafter, the two-layer resist was exposed to light for 40 seconds and heated at 110° C. for 120 seconds. Thereafter, the resist was developed with an organic alkaline developing liquid (NPD-18, manufactured by Nagase ChemteX Corp.) to thereby form a two-layer resist pattern having a shape in which the upper resist layer protruded from the lower resist layer. In FIG. 3 is shown as SEM image (magnification, 50,000 diameters) of a cross-section of the two-layer resist.

A film of Mo was formed in a thickness of 100 nm on the resultant two-layer resist pattern by sputtering. Thereafter, the unnecessary portions of the Mo were removed together with the two-layer resist pattern by a lift-off method to thereby form tapered source and drain electrodes.

Finally, a chloroform solution of a porphyrin derivative which had a bicyclic structure of the heat conversion type undergoing a reverse Diels-Alder reaction upon heating and which is shown in formula (I) was applied by spin coating and heated at 210° C. for 20 minutes to thereby convert and crystallize the porphyrin derivative. Thus, a semiconductor layer was formed.

[Chem. 3]

Formula (I)

M = Cu

Five samples of the field-effect transistor thus obtained were examined with respect to a channel length of 5 μm and a channel width of 500 μm. As a result, a mobility as high as 1.0 cm$^2$/V·s was obtained on average, and the variation of mobility had been reduced to within ±20%.

Figure 4:
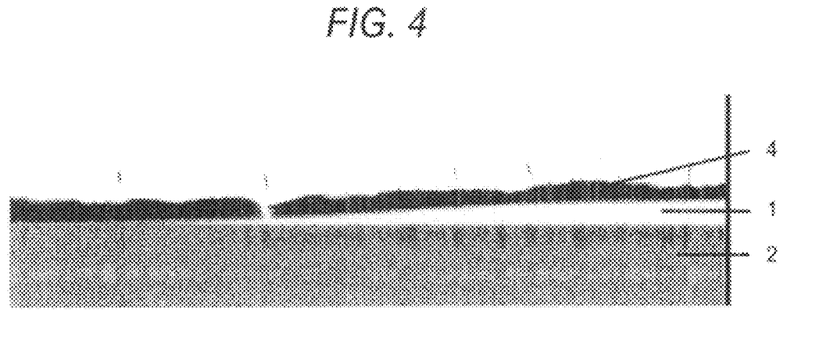
FIG. 4 is an SEM image of a cross-section of the source/drain electrode formed in Example 1.

In FIG. 4 is shown an SEM image of a cross-section of the field-effect transistor obtained. An examination made at a magnification of 50,000 diameters revealed that the angle formed by the taper shape and the substrate was 1°.

Figure 5:
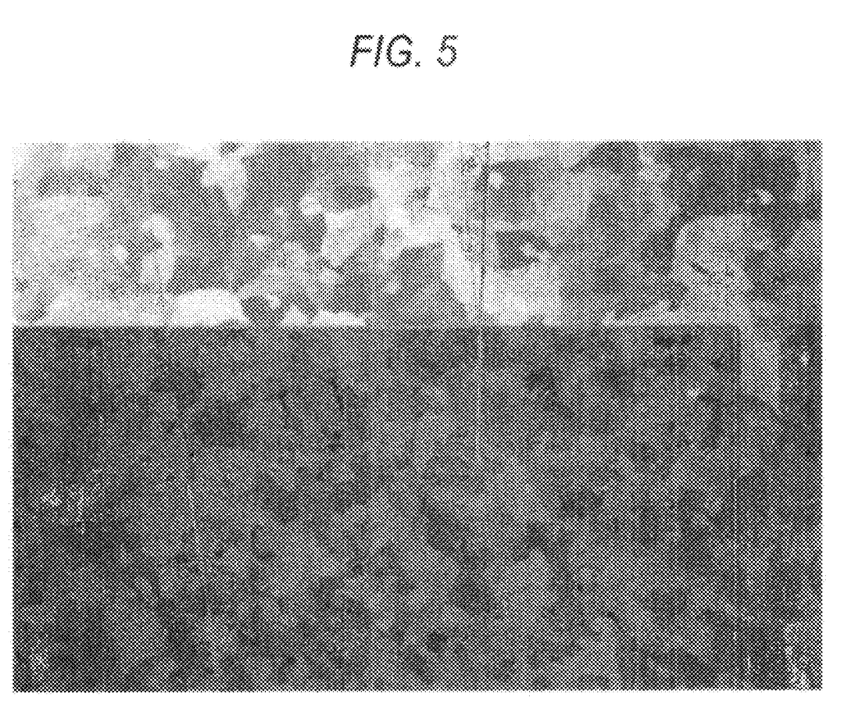
FIG. 5 is a polarization photomicrograph of the field-effect transistor obtained in Example 1.

In FIG. 5 is shown a polarization photomicrograph (magnification, 150 diameters) of the field-effect transistor obtained. There is substantially no difference in size between the semiconductor crystals present on the source/drain electrode of Mo and the semiconductor crystals present on the SiO$_2$ gate insulator. It can be seen that organic semiconductor crystals had grown across the interface between the source/drain electrode and the gate insulator.

It was observed in a video examination of crystal growth that regardless of whether crystal nuclei had generated on the source/drain electrode or on the gate insulator, crystal growth occurred across the interface between the source/drain electrode and the gate insulator.

Example 2

A field-effect transistor was produced in the same manner as in Example 1, except that a 5-nm Cr adhesion layer and 100-nm Au were deposited, in place of the Mo electrodes, on the two-layer resist pattern by vacuum deposition with electron beam heating and resistance heating, respectively.

Five samples of the field-effect transistor thus obtained were examined with respect to a channel length of 13 μm and a channel width of 500 μm. As a result, the samples had a mobility of 0.77 cm$^2$/V·s on average and a variation of mobility of ±10%.

Figure 6:
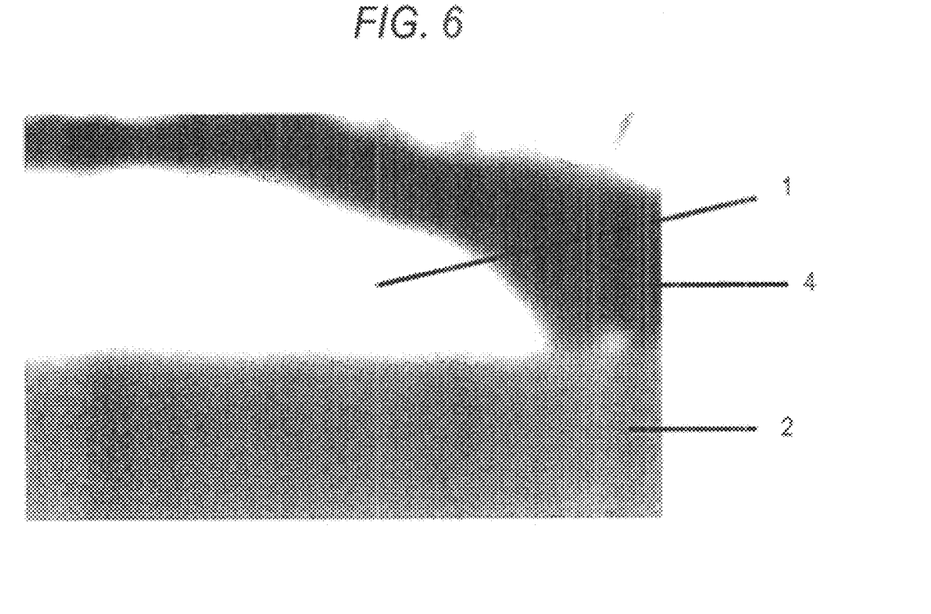
FIG. 6 is an SEM image of a cross-section of the source/drain electrode formed in Example 2.

In FIG. 6 is shown an SEM image of a cross-section of the field-effect transistor obtained. An examination made at a magnification of 50,000 diameters revealed that the angle formed by the taper shape and the substrate was 70°.

Example 3

A field-effect transistor was produced in the same manner as in Example 1, except for the following. A film of OFPR-800LB, which is of the positive type, was formed in a thickness of 1 μm in place of the ZPN-1150 on the SF-9, and photolithography and development were conducted. Furthermore, a 5-nm Cr adhesion layer and 100-nm Au were deposited, in place of the Mo electrodes, on the two-layer resist pattern by vacuum deposition with electron beam heating and resistance heating, respectively.

Five samples of the field-effect transistor thus obtained were examined with respect to a channel length of 12 μm and a channel width of 500 μm. As a result, a mobility as high as 0.70 cm$^2$/V·s was obtained on average, and the variation of mobility was ±20%.

An SEM image of a cross-section of the field-effect transistor obtained was examined in the same manner as in Example 1. As a result, the angle formed by the taper shape and the substrate was found to be 45°.

Example 4

A field-effect transistor was produced in the same manner as in Example 1, except that a 5-nm Cr adhesion layer and 100-nm Au were deposited on the two-layer resist pattern by sputtering.

Five samples of the field-effect transistor thus obtained were examined with respect to a channel length of 12 μm and a channel width of 500 μm. As a result, the samples had a mobility of 0.92 cm$^2$/V·s on average and a variation of mobility of ±20%.

An SEM image of a cross-section of the field-effect transistor obtained was examined in the same manner as in Example 1. As a result, the angle formed by the taper shape and the substrate was found to be 1°.

Comparative Example 1

A field-effect transistor was produced in the same manner as in Example 2, except that the negative type photoresist (ZPN-1150, manufactured by Nippon Zeon Co., Ltd.) only was applied in a thickness of 4 μm by spin coating without using the polymethylglutarimide (PMGI) resist.

Five samples of the field-effect transistor thus obtained were examined with respect to a channel length of 13 μm and a channel width of 500 μm. As a result, the samples had a mobility of 0.28 cm$^2$/V·s on average and a variation of ±40%. An examination with a TEM at a magnification of 100,000 diameters revealed that the angle formed by the taper shape and the substrate was 130° (inverted taper shape).

Figure 7:
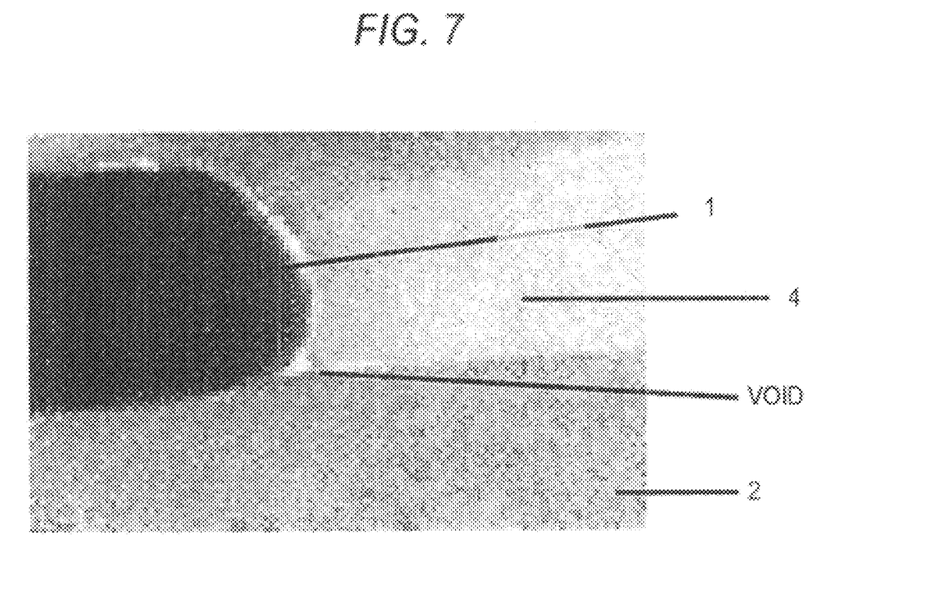
FIG. 7 is a TEM image of a cross-section of the source/drain electrode formed in Comparative Example 1.

In FIG. 7 is shown a TEM image of a cross-section of the field-effect transistor obtained in Comparative Example 1. A lower part of the source/drain electrode had been formed in an inversely tapered shape with respect to the substrate plane, and a void had generated at the interface between the source/drain electrode and the semiconductor layer in the vicinity of the insulating film. It is thought that when a void has generated at the interface between the source/drain electrode and the semiconductor layer, no charge injection occurs at the voided area, resulting in a decrease in mobility and unevenness of semiconductor characteristics.

Comparative Example 2

A field-effect transistor was produced in the same manner as in Comparative Example 1, except that the exposure time was changed to 15 seconds. Five samples of the field-effect transistor thus obtained were examined with respect to a channel length of 10 μm and a channel width of 500 μm. As a result, the samples had a mobility of 0.55 cm$^2$/V·s on average and a variation of ±50%. The angle formed by the taper shape and the substrate was 90°.

Figure 8:
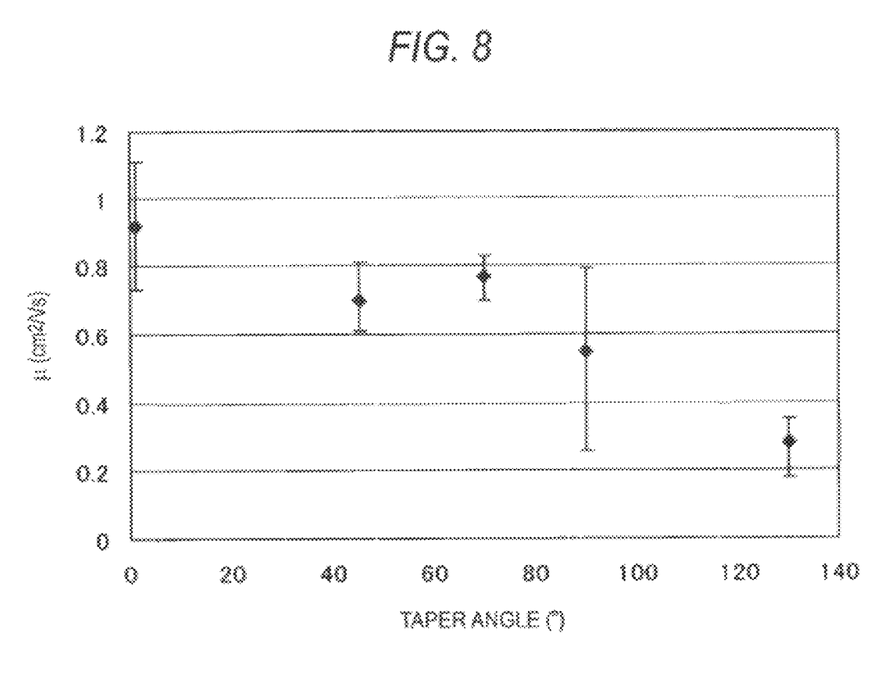
FIG. 8 is a graph showing the average mobilities and taper angles of field-effect transistors having a Cr adhesion layer and a source/drain electrode constituted of Au.
Figure 9:
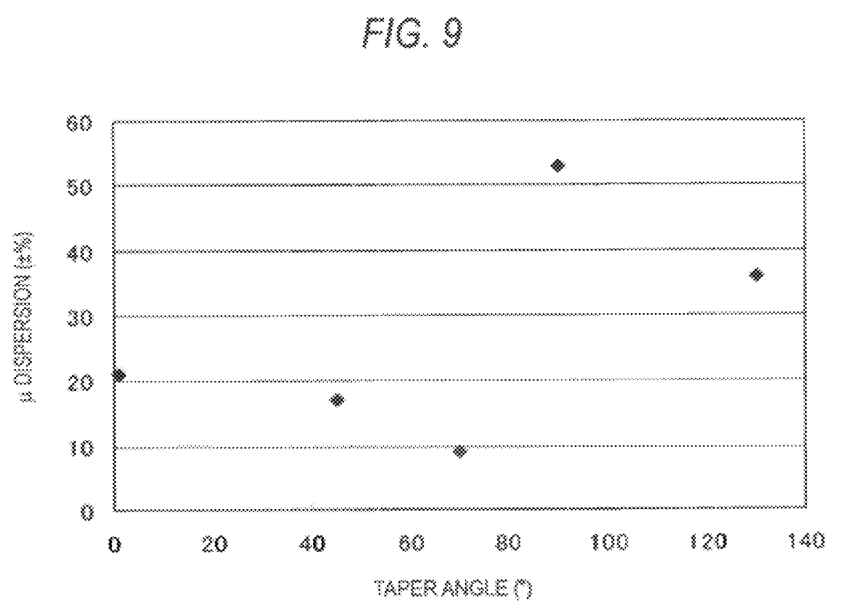
FIG. 9 is a graph showing the mobility variations and taper angles of field-effect transistors having a Cr adhesion layer and a source/drain electrode constituted of Au.

In FIG. 8 is shown a graph showing the mobilities and taper angles of field-effect transistors having a Cr adhesion layer and an Au electrode and including a semiconductor formed from a film of bicyclobenzoporphyrin. In FIG. 9 is shown a graph showing the mobility variations and taper angles of field-effect transistors having a Cr adhesion layer and an Au electrode. It can be seen that an improvement in mobility and a reduction in mobility variation were attained by forming a source/drain electrode so that the source/drain electrode had a taper shape in a cross-section which was parallel with the channel length direction and perpendicular to the substrate. In particular, by regulating the angle formed by the taper shape and the substrate (taper angle) to 70° or less, a high mobility and a low variation of mobility were obtained. It has also become obvious that the smaller the taper angle, the higher the mobility.

Comparative Example 3

A field-effect transistor was produced in the same manner as in Comparative Example 1, except that pentacene was used, in place of the heat conversion type bicycloporphyrin, and vacuum-deposited at a rate of 1 Å/s so as to result in a film thickness of 50 nm, thereby forming a semiconductor layer. The angle formed by the taper shape and the substrate was 130° (inverted taper shape). Three samples of the field-effect transistor thus obtained were examined with respect to a channel length of 13 µm and a channel width of 500 µm. As a result, the samples had a mobility of 0.0088 cm$^2$/V·s on average.

Comparative Example 4

A field-effect transistor was produced in the same manner as in Comparative Example 2, except that pentacene was used, in place of the heat conversion type bicycloporphyrin, and vacuum-deposited to form a semiconductor layer. The angle formed by the taper shape and the substrate was 90°. Three samples of the field-effect transistor thus obtained were examined with respect to a channel length of 10 µm and a channel width of 500 µm. As a result, the samples had a mobility of 0.014 cm$^2$/V·s on average.

Comparative Example 5

A field-effect transistor was produced in the same manner as in Example 2, except that pentacene was used, in place of the heat conversion type bicycloporphyrin, and vacuum-deposited to form a semiconductor layer. The angle formed by the taper shape and the substrate was 70°. Three samples of the field-effect transistor thus obtained were examined with respect to a channel length of 13 µm and a channel width of 500 µm. As a result, the samples had a mobility of 0.0028 cm$^2$/V·s on average.

Comparative Example 6

A field-effect transistor was produced in the same manner as in Example 3, except that pentacene was used, in place of the heat conversion type bicycloporphyrin, and vacuum-deposited to form a semiconductor layer. The angle formed by the taper shape and the substrate was 45°. Three samples of the field-effect transistor thus obtained were examined with respect to a channel length of 12 µm and a channel width of 500 µm. As a result, the samples had a mobility of 0.0070 cm$^2$/V·s on average.

The results of Comparative Examples 3 to 6 show that in the case where a semiconductor layer was formed by vacuum deposition, reductions in the taper angle of the source/drain electrode resulted in no improvement in mobility.

This application is based on a Japanese patent application filed on Apr. 10, 2009 (Application No. 2009-096131), the contents thereof being incorporated herein by reference.

INDUSTRIAL APPLICABILITY

According to the invention, a field-effect transistor which has a high mobility and a low variation of mobility can be obtained.

The field-effect transistor of the invention can be utilized in various electronic devices including flat panel displays, flexible displays, electronic tags, and light/pressure sensors.

DESCRIPTION OF THE REFERENCE NUMERALS

1 Source/drain electrode
2 Gate insulator
3 Gate electrode
4 Semiconductor layer

The invention claimed is:

1. A field-effect transistor which at least comprises a substrate, a semiconductor layer formed through coating process, a source electrode, and a drain electrode, wherein, in a cross-section which is parallel with a channel length direction and perpendicular to the substrate, the source electrode and/or the drain electrode has a taper shape and the taper shape forms an angle of 30° or less with the substrate.

2. The field-effect transistor according to claim 1, wherein the semiconductor is an organic semiconductor having an annulene structure.

3. The field-effect transistor according to claim 1, which has a variation of mobility of ±30% or less.

4. A process for producing a field-effect transistor at least comprising a substrate, a semiconductor layer, a source electrode, and a drain electrode, the process comprising; forming the source electrode and/or the drain electrode so that the source electrode and/or the drain electrode has a taper shape in a cross-section which is parallel with a channel length direction and perpendicular to the substrate; and coating a coating solution that contains a semiconductor,
wherein said taper shape forms an angle of 30° or less with the substrate.

5. A process for producing a field-effect transistor at least comprising a substrate, a semiconductor layer, a source electrode, and a drain electrode, the process comprising: forming the source electrode and/or the drain electrode so that the source electrode and/or the drain electrode has a taper shape in a cross-section which is parallel with a channel length direction and perpendicular to the substrate; coating a coating solution that contains a precursor for a semiconductor; and converting the precursor to a semiconductor by heating and/or light irradiation,
wherein said taper shape forms an angle of 30° or less with the substrate.

6. A process for producing a field-effect transistor, at least comprising a substrate, a semiconductor layer, a source electrode, and a drain electrode, the process comprising; forming the source electrode and/or the drain electrode so that the source electrode and/or the drain electrode has a taper shape in a cross-section which is parallel with a channel length direction and perpendicular to the substrate; and coating a coating solution that contains a semiconductor,
wherein said taper shape forms an angle of 30° or less with the substrate, and
wherein the source electrode and/or drain electrode which has a taper shape is formed by forming two resist layers, exposing an photoresist layer to light, removing the uncured portions, forming a metal layer, and then removing unnecessary portions of the metal layer by a lift-off method.

7. A field-effect transistor produced by the process according to claim 4 or 5.

8. A method for improving a mobility of a field-effect transistor at least comprising a substrate, a semiconductor layer formed through coating process, a source electrode, and a drain electrode, wherein when the field-effect transistor is produced, the source electrode and/or the drain electrode is formed so that the source electrode and/or the drain electrode has a taper shape in a cross-section which is parallel with a channel length direction and perpendicular to the substrate, thereby improving the mobility,
wherein said taper shape forms an angle of 30° or less with the substrate.

9. An electronic device comprising the field-effect transistor according to claim 1.

10. The field-effect transistor according to claim 1, wherein said taper shape forms an angle of less than 30° with the substrate.

11. The field-effect transistor according to claim 4, wherein said taper shape forms an angle of less than 30° with the substrate.

12. The field-effect transistor according to claim 5, wherein said taper shape forms an angle of less than 30° with the substrate.

13. The field-effect transistor according to claim 8, wherein said taper shape forms an angle of less than 30° with the substrate.

14. The field-effect transistor according to claim 1, wherein a semiconductor layer formed through a coating process is formed by a method in which a coating solution comprising a precursor for a semiconductor is applied and said precursor is thereafter converted to said semiconductor.

15. The field-effect transistor according to claim 14, wherein said precursor is converted by a reverse Diels-Alder reaction.

16. An electronic device comprising the field-effect transistor according to claim 7.

17. A process for producing a field-effect transistor at least comprising a substrate, a semiconductor layer, a source electrode, and a drain electrode, the process comprising; forming the source electrode and/or the drain electrode so that the source electrode and/or the drain electrode has a taper shape in a cross-section which is parallel with a channel length direction and perpendicular to the substrate; and coating a coating solution that contains a semiconductor,
wherein said taper shape forms an angle of 30° or less with the substrate; and
wherein the source electrode and/or drain electrode which has a taper shape is formed by forming two resist layers, and forming a shape in which an upper photoresist layer overhangs, and forming a metal layer, and then removing unnecessary portions of said metal layer.

18. The process for forming a field-effect transistor according to claim 17, wherein said forming a shape in which said upper photoresist layer overhangs is formed by forming a film of a photoresist on a lower resist layer which is not photosensitive, exposing said photoresist to light and then developing said layers while regulating the developing time.

* * * * *